United States Patent
Schneider

(10) Patent No.: US 6,310,477 B1
(45) Date of Patent: Oct. 30, 2001

(54) MR IMAGING OF LESIONS AND DETECTION OF MALIGNANT TUMORS

(75) Inventor: Erika Schneider, Pawcatuck, CT (US)

(73) Assignee: General Electric Company, Schenectady, NY (US)

(*) Notice: Subject to any disclaimer, the term of this patent is extended or adjusted under 35 U.S.C. 154(b) by 0 days.

(21) Appl. No.: 09/307,482

(22) Filed: May 10, 1999

(51) Int. Cl.$^7$ ................................................ G01V 3/00
(52) U.S. Cl. ................................. 324/307; 600/407
(58) Field of Search ................................ 324/309, 307, 324/306, 314, 312, 300; 600/407, 410, 411, 420

(56) References Cited

U.S. PATENT DOCUMENTS

| | | | |
|---|---|---|---|
| 4,431,968 | 2/1984 | Edelstein et al. | 324/309 |
| 4,665,365 | 5/1987 | Glover et al. | 324/309 |
| 4,719,585 | 1/1988 | Cline et al. | 364/518 |
| 4,952,877 | 8/1990 | Stormont et al. | 324/312 |
| 4,992,736 | 2/1991 | Stormont et al. | 324/309 |
| 5,003,979 | * 4/1991 | Merickel et al. | 128/653 |
| 5,122,747 | 6/1992 | Riederer et al. | 324/309 |
| 5,568,384 | 10/1996 | Robb et al. | 364/419.13 |
| 6,175,755 | * 1/2001 | Hogg et al. | 600/407 |

OTHER PUBLICATIONS

"Suspicious Breast Lesions: MR Imaging With Radiologic–Pathologic Correlation," Radiology 1997; 190:485–493, Greenstein et al.

"Breast MR Imaging: Interpretation Model," Radiology 1997; 202:833–841, White Nunes et al.

"Comparison of Eye Position Versus Computer Identified Microcalcification Clusters On Mammograms," Med. Phys, 24(1), Jan. 1997, pp. 17–23, Krupinski et la.

"An Improved Shift–Invariant Artificial Neural Network for Computerized Detection of Clustered Microcalcifications in Digital Mammograms," Med. Phys. 23(4), Apr. 1996, Wei.

"Quality Control of Mamography For Breat Cancer Screening," Clinical Practice Guidelines, May/Jun. 1997, vol. 4, No. 3, 258–261, Robert Clark, M.D.

* cited by examiner

Primary Examiner—Louis Arana
(74) Attorney, Agent, or Firm—Jean K. Testa; Donald S. Ingraham

(57) ABSTRACT

A 3D MR image is acquired before injection of a contrast agent and an enhanced 3D image is acquired after injection of the contrast agent. The two images are registered and then subtracted to remove background and to highlight lesion voxels. Lesion objects are identified by connecting contiguous lesion objects. Volume and surface area of any continuous lesion object in a discrete digital image are then calculated. Malignant lesions are identified by determining the ratio of volume to surface area for each lesion object. Malignant tumors are identified when this ratio drops below a preset threshold.

10 Claims, 4 Drawing Sheets

MR IMAGING OF LESIONS AND DETECTION OF MALIGNANT TUMORS

BACKGROUND OF THE INVENTION

This invention relates to nuclear magnetic resonance imaging methods and systems and, more particularly, to imaging of lesions and differentiation of benign and malignant lesions.

Early detection of breast cancer is of great importance in treating the disease. The primary method currently used to detect the disease is x-ray mammography. While this imaging modality is widely used, it has limitations in sensitivity and specificity.

It has been recognized for many years that magnetic resonance imaging may be used to detect breast lesions. When a substance such as human tissue is subjected to a uniform magnetic field (polarizing field $B_0$) along the z direction in a Cartesian coordinate system, the individual magnetic moments of the spins in the tissue attempt to align with this polarizing field, but precess about it in random order at their characteristic Larmor frequency. If the substance, or tissue, is subjected to a magnetic field (excitation field $B_1$) which is in the x-y plane and which is near the Larmor frequency, the net aligned moment, $M_z$, may be rotated, or "tipped", into the x-y plane to produce a net transverse magnetic moment $M_t$. A signal is emitted by the excited spins after the excitation signal $B_1$ is terminated, and this signal may be received and processed to form an image. Some reports indicate that MR (magnetic resonance) images have a 100% sensitivity in the detection of malignant breast lesions. Using contrast enhanced MR imaging methods, malignant and benign tumors that cannot be seen with x-ray mammography can be seen on MR images.

Although MR imaging is an excellent modality for detecting the presence of lesions, the ability to differentiate benign lesions from malignant lesions is also required if MRI (magnetic resonance imaging) is to become a viable adjunct to x-ray mammography in the detection and diagnosis of breast cancer. Guidelines for standardization of x-ray mammography reading have defined signs of early breast cancer to be: tumor mass, usually irregularly marginated or spiculated; small, grouped (clustered) calcifications with or without a mass; poorly defined, asymmetric breast parenchyma, especially if developed since a prior exam; and, distortion of the breast parenchymal architecture by scirrhous tumor. The distinction between benign and malignant masses is generally made by analysis of the margins, shape, density and size of the detected lesions. Generally, a benign mass such as a cyst, lymph node, and fibroadenoma has a sharply circumscribed margin, oval or round shape. Fat-containing masses that are well circumscribed are always benign. Malignancies have a "benign" appearance in less than 1–2% of the cases where they are greater than 1.0 cm in diameter. Papillary, medullary, and colloid carcinomas are more likely to be well circumscribed than the more common ductal and lobular carcinomas. The most important and specific feature of malignant masses greater than 1.0 cm in diameter in x-ray mammography is a speculated margin, which is due to the infiltrative nature of the cancer. Irregularity and indistinctness of margins are less common manifestations of this phenomenon.

By incorporating the above morphologic x-ray mammography breast lesion characteristics (excepting those for calcifications) the specificity of characterizing MR-visible breast lesions has been significantly increased. The "architectural features" which have been found to be most useful in characterizing MR-visible breast lesions include: lesion border irregularity (spiculation, 76–88%); non-uniform lesion enhancement (peripheral rim enhancement, 79–92%); and enhancement patterns which simulate ductal structures. Conversely, smooth bordered or lobulated lesions, particularly with internal septations, has been found to be predictive (97–100%) of benign disease. Likewise, non-enhancement, or negative enhancement, of the lesion was (100%) predictive of benign disease. Such morphologic assessment of breast lesions requires high spatial resolution 3D MR images acquired during the immediate post contrast-phase. Using this morphologic method of characterizing MR-visible breast lesions, an overall specificity of 74% has been obtained with a sensitivity of 96% for MR-visible breast lesions for radiologic reading.

Despite the use of both architectural features and temporal contrast enhancement to characterize MR-visible breast lesions, it has not been possible to characterize lesions as either benign or malignant with 100% certainty except through use of MR-guided biopsy techniques.

SUMMARY OF THE INVENTION

The present invention is a method for acquiring MR images which depict lesions and for analyzing the depicted lesions to detect malignant tumors. The method includes the steps of acquiring NMR image data and reconstructing an image therefrom, detecting voxels in the image which indicate the presence of a lesion, connecting contiguous lesion voxels to form lesion objects, calculating the volume of each lesion object, calculating the surface area of each lesion object, calculating the volume to surface area ratio of each lesion object, and indicating the presence of a malignant tumor for any lesion object having a volume to surface ratio that reaches a preset threshold. A large ratio of lesion volume to lesion surface area is indicative of a benign lesion with smooth borders. However, a lesion with spiculated borders has a significantly lower ratio and is indicative of a malignant or infiltrative tumor.

Another aspect of the invention is to accurately measure surface area and volume of lesions in MR images. High resolution 3D (three-dimensional) MR images are acquired both before and after arrival of a contrast enhancement agent such as Gd-DTPA. The two images are subtracted to remove background signal. The borders of lesion objects are more precisely identified by estimating the percent of lesion contained in each border voxel based on the signal level of the border voxel. This enables a more accurate measurement of both the volume and surface area of each lesion object.

DESCRIPTION OF THE PREFERRED EMBODIMENT

Figure 1:
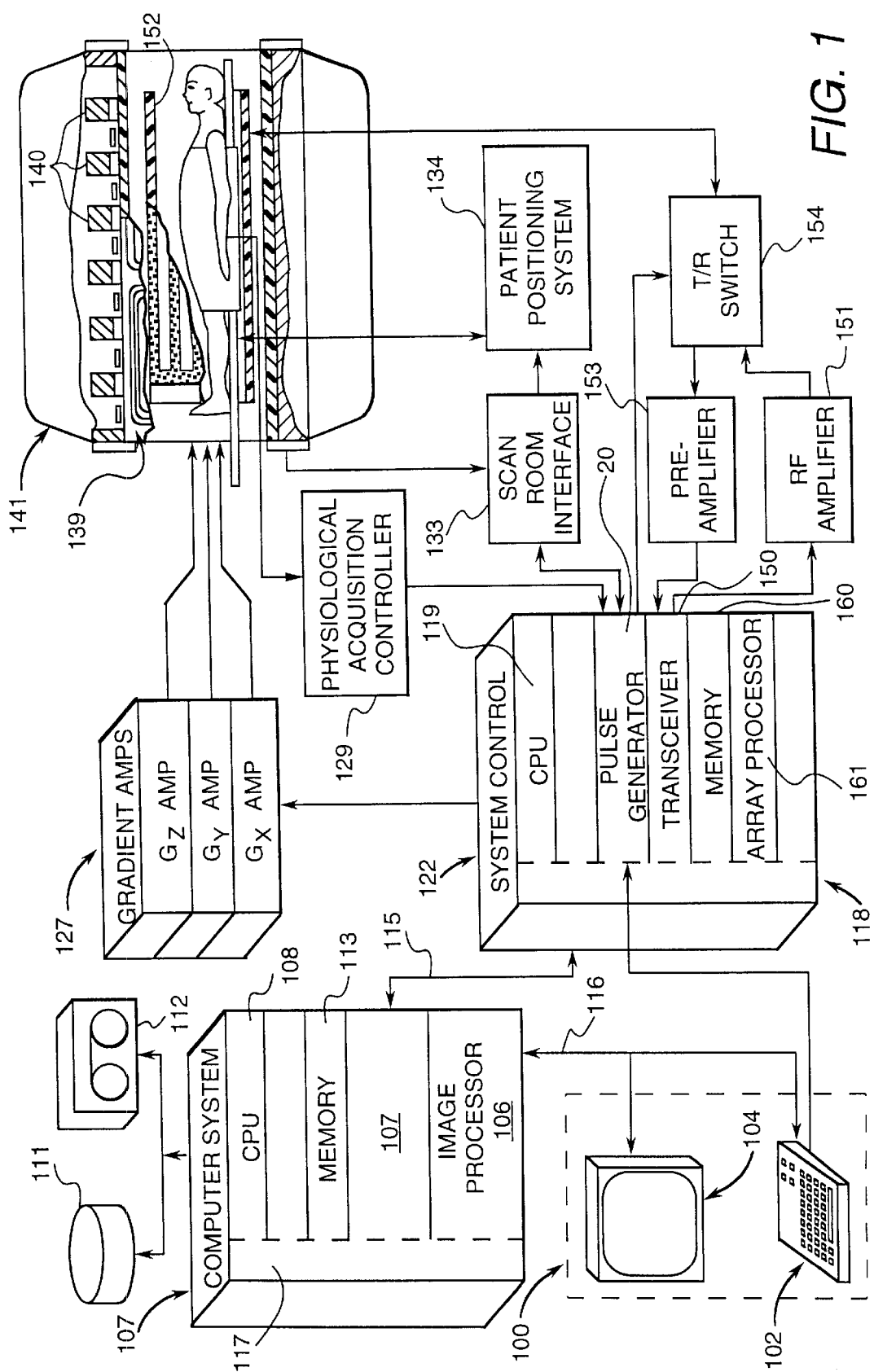
FIG. 1 is a block diagram of an MRI system which employs the present invention.

FIG. 1 shows the major components of a preferred MRI system incorporating the invention. Operation of the system is controlled from an operator console 100 which includes a keyboard and control panel 102 and a display 104. Console 100 communicates through a link 116 with a separate computer system 107 that enables an operator to control the production and display of images on display 104. Computer system 107 includes a number of modules which communicate with each other through a backplane 117. These modules include an image processor 106, a CPU (central processing unit) 108 and a memory 113, known in the art as a frame buffer for storing image data arrays. Computer system 107 is linked to a disk memory 111 and a tape drive 112 for storing image data and programs, and communicates with a separate system control 122 through a high speed serial link 115.

System control 122 includes a set of modules interconnected through a backplane 118. The modules of system control 122 include a CPU 119 and a pulse generator 121 which is coupled to operator console 100 through a serial link 125. System control 122 receives, through link 125, commands from the operator which specify the scan sequence that is to be performed. Pulse generator module 121 operates the system components to carry out the desired scan sequence, producing data that indicate the timing, strength and shape of the RF pulses which are to be produced, and the timing and length of the data acquisition window. Pulse generator module 121 is coupled to a set of gradient amplifiers 127 to indicate the timing and shape of the gradient pulses to be produced during the scan. Pulse generator module 121 also receives patient data from a physiological acquisition controller 129 that receives signals from a number of different sensors monitoring the patient, such as ECG (electrocardiogram) signals from electrodes or respiratory signals from a bellows. Pulse generator module 121 is additionally coupled to a scan room interface circuit 133 which receives signals from various sensors associated with the condition of the patient and the magnet system. A patient positioning system 134 receives commands through scan room interface circuit 133 to move the patient to the desired position for the scan.

The gradient waveforms produced by pulse generator module 121 are applied to a gradient amplifier system 127 comprised of $G_x$, $G_y$ and $G_z$ amplifiers. Each gradient amplifier excites a corresponding gradient coil in an assembly 139 to produce the magnetic field gradients used for position encoding acquired signals. Gradient coil assembly 139 forms part of a magnet assembly 141 which includes a polarizing magnet 140 and a whole-body RF coil 152. A transceiver module 150 in system control 122 produces pulses which are amplified by an RF amplifier 151 and coupled to RF coil 152 by a transmit/receive switch 154. The resulting signals radiated by the excited nuclei in the patient may be sensed by the same RF coil 152 and coupled through transmit/receive switch 154 to a preamplifier 153. The amplified NMR (nuclear magnetic resonance) signals are demodulated, filtered, and digitized in the receiver section of transceiver 150. Transmit/receive switch 154 is controlled by a signal from pulse generator module 121 to electrically couple RF amplifier 151 to coil 152 during the transmit mode and to couple coil 152 to preamplifier 153 during the receive mode. Transmit/receive switch 154 also enables a separate RF coil (for example, a head coil or surface coil, not shown) to be used during either the transmit or receive mode.

The NMR signals picked up by RF coil 152 are digitized by transceiver module 150 and transferred to a memory module 160 in system control 122. When the scan is completed and an entire array of data has been acquired in memory module 160, an array processor 161 operates to Fourier transform the data into an array of image data. The image data are conveyed through serial link 115 to computer system 107 where they are stored in disk memory 111. In response to commands received from operator console 100, the image data may be archived on tape drive 112, or may be further processed, as described below, by image processor 106, conveyed to operator console 100 and presented on display 104.

For a more detailed description of transceiver 150, reference is made to Stormont et al. U.S. Pat. Nos. 4,952,877, issued Aug. 28, 1990 and 4,992,736, issued Feb. 12, 1991, both of which are assigned to the instant assignee and incorporated herein by reference.

Figure 2:
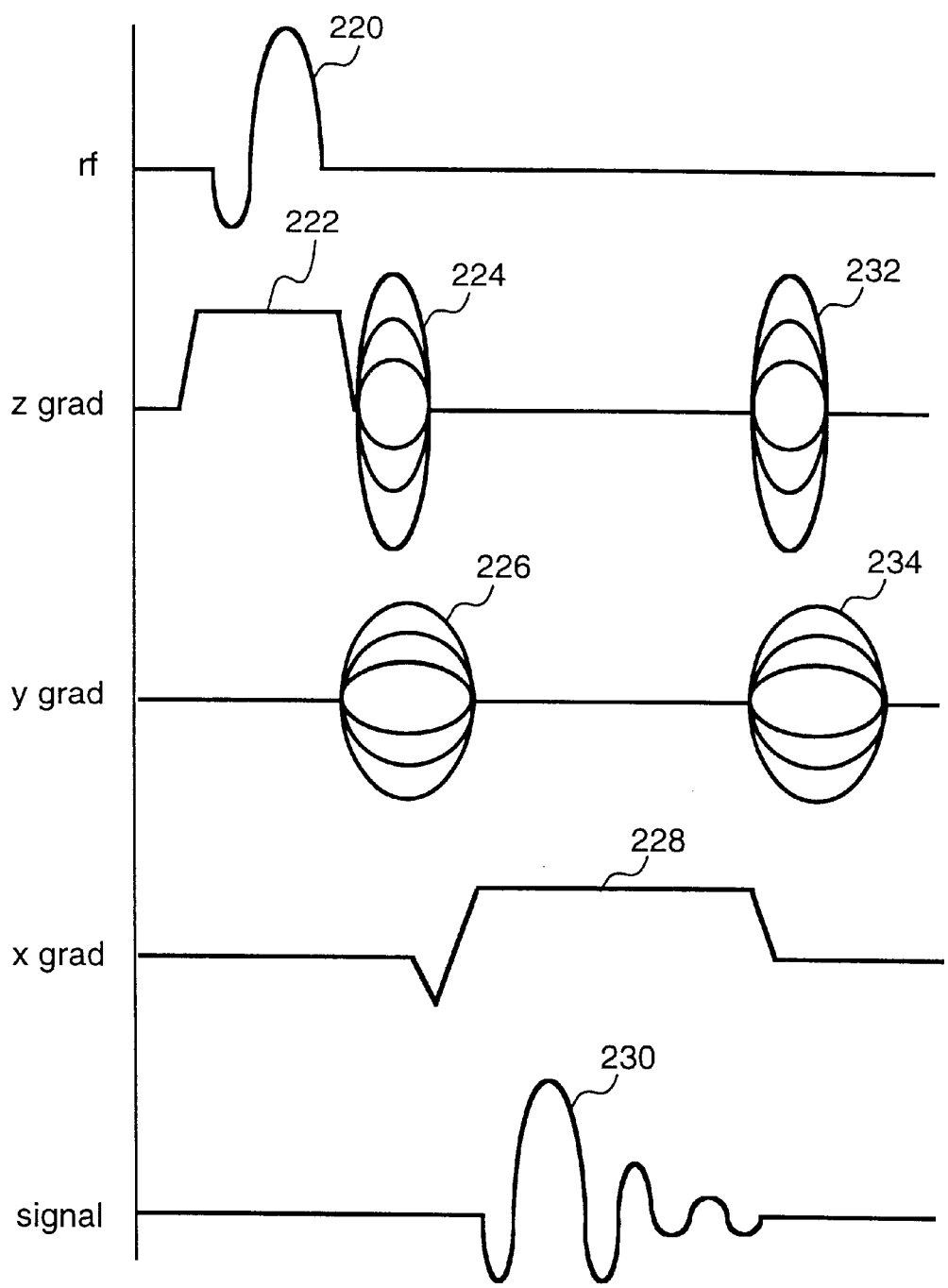
FIG. 2 is a graphic representation of a 3DFT (three-dimensional Fourier Transform) pulse sequence used by the MRI system of FIG. 1 to acquire image data.

Although the invention can be used with a number of different pulse sequences, the preferred embodiment of the invention employs a 3D gradient recalled echo pulse sequence depicted in FIG. 2. The pulse sequences "3dfgre" and/or "efgre3d" available on the General Electric 1.5 Tesla MR scanner sold under the trademark "SIGNA" with revision level 5.6 system software have been used.

FIG. 2 shows an RF (radio frequency) excitation pulse 220 produced in the presence of a slab select gradient pulse 222 to produce transverse magnetization in the 3D volume of interest as taught in Edelstein et al. U.S. Pat. No. 4,431,968, issued Feb. 14, 1984 and assigned to the instant assignee.. This is followed by a phase encoding gradient pulse 224 directed along the z axis and a phase encoding gradient pulse 226 directed along the y axis. A readout gradient pulse 228 directed along the x axis follows and a partial echo (60%) NMR signal 230 is acquired and digitized as described above. After the acquisition, rewinder gradient pulses 232 and 234 rephase the magnetization before the pulse sequence is repeated as taught in Glover et al. U.S. Pat. No. 4,665,365, issued May 12, 1987 and assigned to the instant assignee.

As is well known in the art, the pulse sequence is repeated and the phase encoding pulses 224 and 226 are stepped through a series of values to sample the 3D k-space (or three-dimensional, spatial frequency space). In the preferred embodiment, 24 phase encodings are employed along the z axis and 256 phase encodings are employed along the y axis. For each particular y phase encoding, therefore, 24 acquisitions with 24 different z phase encodings are performed to sample completely along the $k_z$ axis. This is repeated 256 times with 256 different y phase encodings to sample completely along the $k_y$ axis.

Sampling along the $k_x$ axis is performed by sampling the echo signal 230 in the presence of readout gradient pulse 228 during each pulse sequence. A total of 512 samples are obtained, but only a partial sampling along the $k_x$ axis is performed and the missing data are computed using a homodyne reconstruction or by zero filling. This enables the echo time (TE) of the pulse sequence to be shortened to less than 1.8 to 2.0 milliseconds and the pulse repetition rate (TR) to be shortened to less than 10.0 milliseconds. In the preferred embodiment, an echo time (TE) is used such that the NMR signals from water and fat spins are in phase.

A centric view order is used in the preferred embodiment to acquire a complete 3D k-space data set. Alternatively, spiral sampling of k-space may be used, wherein the phase encoding gradients are stepped through values which sample 3D k-space starting at its center and working outward in a single spiral path. As a result, the central region of k-space is sampled first and the peripheral region is sampled last. The acquired 3D k-space is then used to reconstruct an image by performing a Fourier transformation along each of its three axes.

Figure 3:
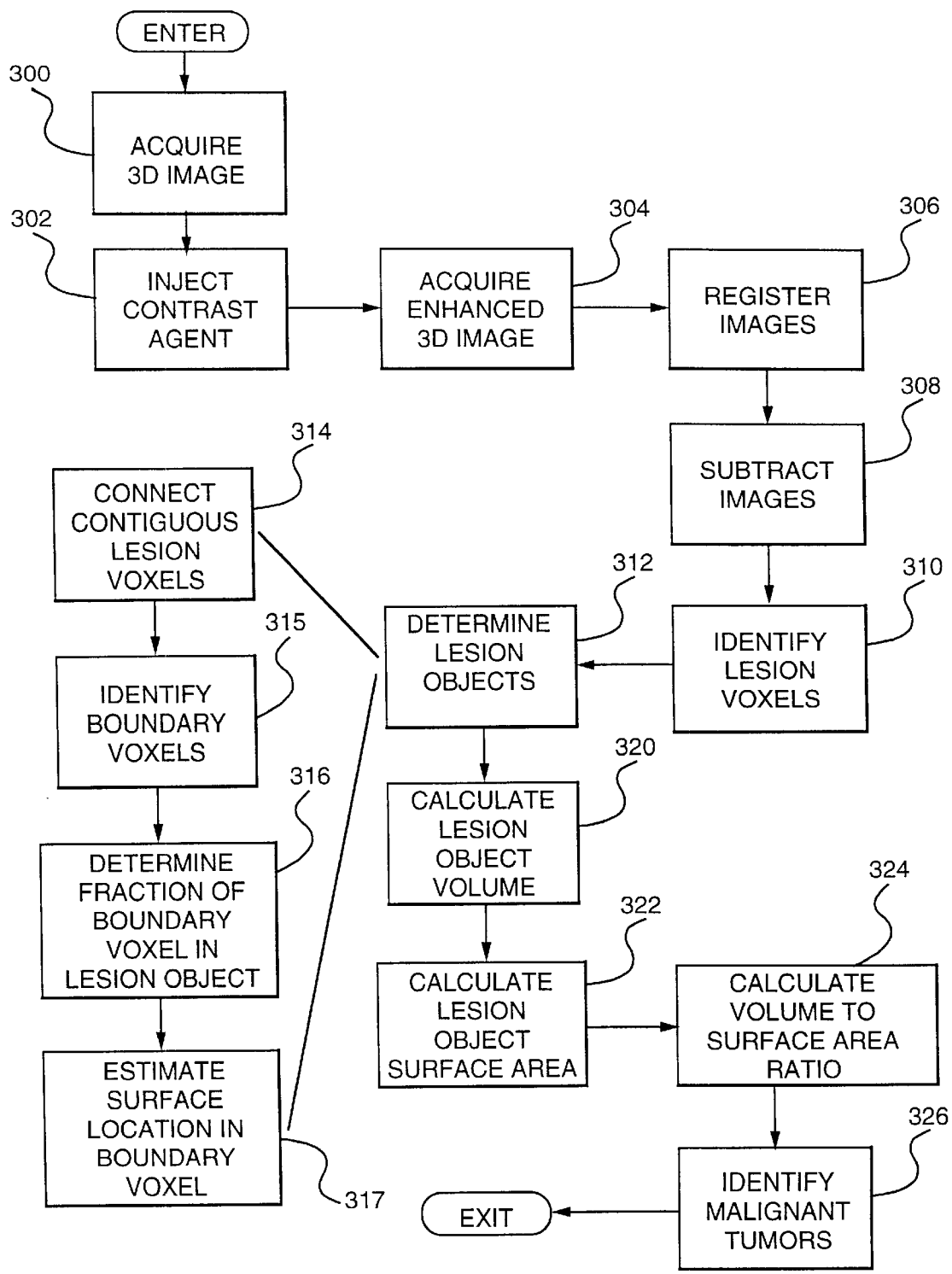
FIG. 3 is a flow chart showing the steps used in the preferred method for practicing the invention on the MRI system of FIG. 1.

As shown in FIG. 3, the MRI system of FIG. 1 is employed to conduct a scan in which a 3D image of particular patient anatomy is acquired, as indicated at process step 300. The pulse sequence of FIG. 2 may be used, for example, to image the breast. The reconstructed 3D image is stored in the computer system memory 113 (FIG. 1) and a contrast agent is injected into the patient as indicated at process step 302. When the contrast agent arrives in the vasculature of the anatomy of interest, a second 3D image is acquired, reconstructed and stored as indicated at process step 304. The remainder of the procedure is performed by the computer system 107 (FIG. 1) using these two acquired 3D images.

The two 3D images are registered to each other as indicated at process step 306 to ensure that the corresponding voxels therein depict the same anatomy. Methods for registering medical images are well-known to those skilled in the art. After registration of the images, and as indicated at process step 308, the first 3D image is subtracted from the enhanced 3D image; that is, the "background" signal value for each voxel in the first 3D image is subtracted from the "enhanced" signal value of the corresponding voxel in the enhanced 3D image, resulting in a difference image which indicates those image voxels in which blood containing contrast agent is present. A characteristic of malignant or rapidly growing lesions is that they are heavily vascularized and thus appear very bright in this difference image. As indicated at process step 310, the lesion voxels are identified in the difference image by identifying those voxels with a signal value, or brightness, above a preset threshold.

The next step is to determine, from the identified lesion voxels, the lesion objects present in the image. As indicated at process step 312, four separate steps 314–317 are performed in determining the lesion objects present in the image. First, contiguous lesion voxels are identified and "connected" together to form lesion objects, as indicated at process step 314. The lesion voxels are first identified by zeroing all voxels which have signal intensity below a predetermined threshold value, typically $0.15*(\text{maximum amplitude})^2$ and, the adjacent voxels are then connected by using any of several methods. One such method is that disclosed in Cline et al. U.S. Pat. No. 4,719,585, issued Jan. 12, 1988, assigned to the instant assignee, and entitled *Dividing Cubes System and Method for The Display of Surface Structures Contained Within the Interior Region of a Solid Body*, which is hereby incorporated by reference. As indicated at process step 315, the voxels lying on the boundary of each lesion object are then identified. The fraction of the voxels within the lesion is next determined, as indicated at process step 316, by comparing the brightness value of the boundary voxels with an average of the voxel brightness values within the lesion object. Specifically, the fraction of the boundary voxels within the lesion is estimated as the ratio of the boundary voxel brightness value over the average lesion object brightness value (i.e., extent of partial volume filling). As indicated at process step 317, this enables the location of the lesion surface within the boundary voxels to be estimated.

After the lesion objects have been identified and their surfaces estimated, the volume of each lesion object is calculated, as indicated at process step 320. This calculation is performed by simply counting the number of voxels in each lesion object plus the fractional boundary voxels. The dimensions of each voxel are known from the NMR scan parameters (i.e. slice thickness, field of view, number of phase encodings and number of readout samples). Next, the surface area of each lesion object is calculated at process step 322 by adding the surface area of each boundary voxel in a piecewise continuous manner.

Figure 4:
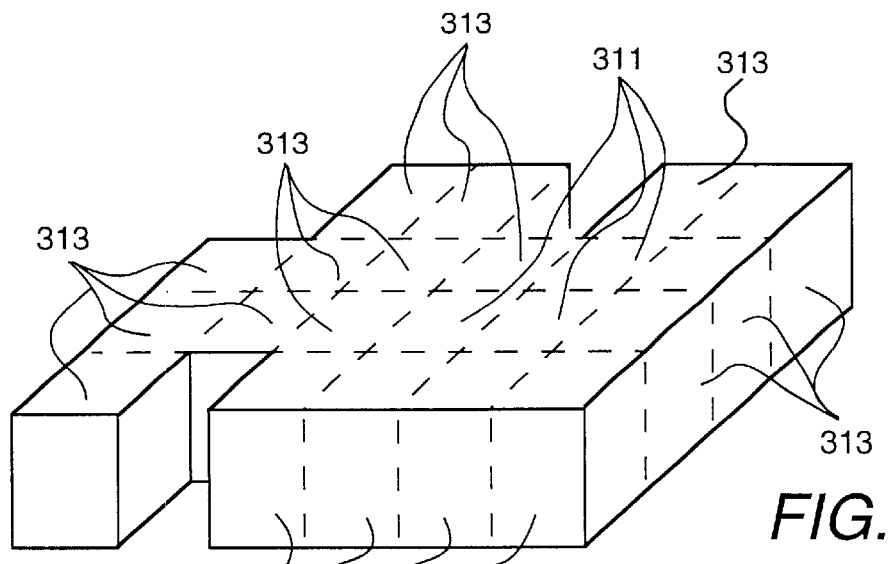
FIG. 4 is a pictorial representation of voxels in a slice of an exemplary lesion detected using the method shown in FIG. 3.
Figure 5:
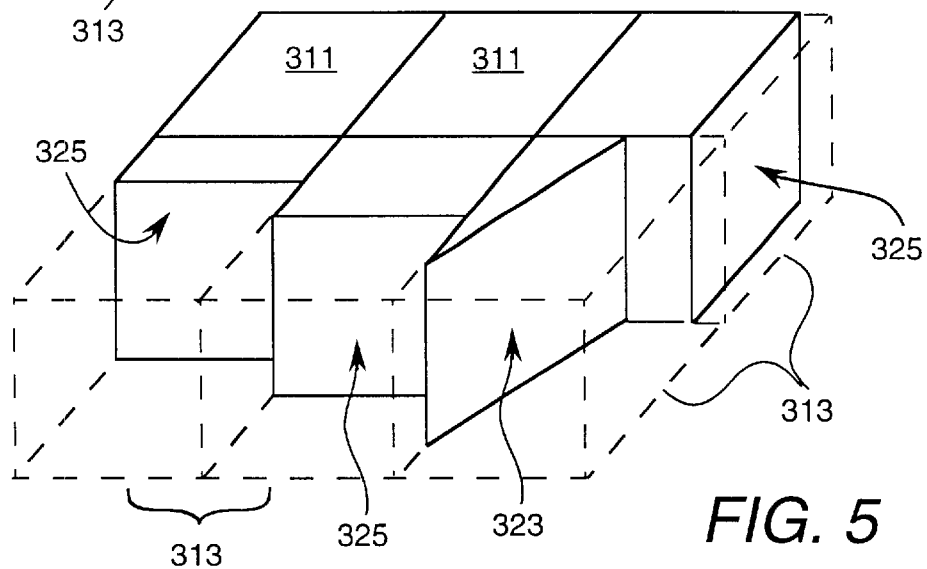
FIG. 5 is a pictorial representation of fractional filling of boundary voxels in the slice of FIG. 4.
Figure 6:
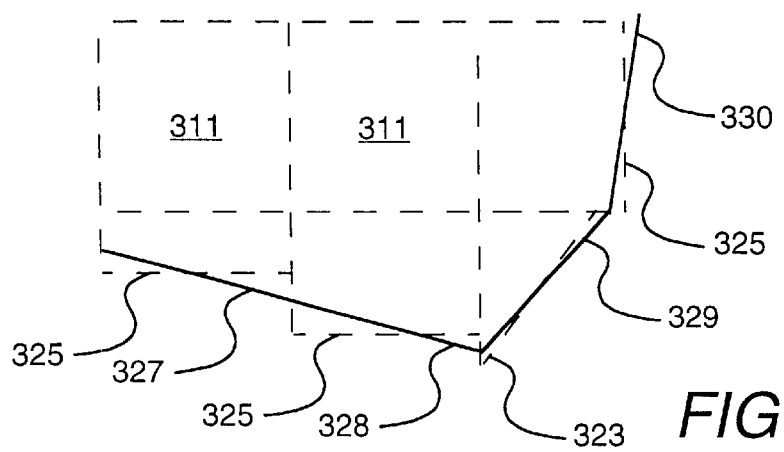
FIG. 6 is a top view of the boundary voxels of FIG. 5 illustrating adjustment of the boundary surface areas to form a piecewise continuous surface.

This measurement of lesion objects is depicted in FIGS. 4–6. Each contiguous set of lesion voxels which form a lesion object is processed one slice at a time. As shown in FIG. 4, one such slice through a lesion object may contain six central voxels 311 and fourteen boundary voxels 313. The fraction of each boundary voxel 313 within the lesion is determined as described above, and each boundary voxel 313 is partially filled by a corresponding amount. This partial filling is illustrated in FIG. 5 for part of the lesion slice shown in FIG. 4, and defines the boundary of the slice as a series of discontinuous flat surface areas, where the angle of the flat surface is determined by the perpendicular of the line from the boundary voxel to the center of the adjacent central voxel. Thus, corner voxels will create diagonal surface areas 323 and the remaining boundary voxels create surface areas 325 set back a distance corresponding to the partial filling. The lesion surface area produced by each slice can be estimated by summing these surface areas 323 and 325, but in the preferred embodiment an additional step is performed to improve accuracy. As illustrated in FIG. 6, the discontinuous surface areas 323 and 325 are made piecewise continuous by adjusting their orientation in space. This produces more accurate surface areas, as indicated by surface 327–330 in FIG. 6.

The ratio of lesion object volume to its surface area may now be calculated as indicated in FIG. 3 at process step 324. This is done for every lesion object identified in the 3D image. Those lesion objects which are likely to be malignant tumors are then identified, as indicated at process step 326. Step 326 is performed by comparing the calculated volume to surface ratio of the lesion object with a preselected threshold. If the threshold is crossed, the pixels corresponding to the lesion object are colored to highlight them in the displayed 3D image. In addition, all the lesion objects can be color coded to indicate those which are benign, those which are near the threshold, and those which clearly cross the threshold and are malignant.

The surface area of a spherical volume is $4\pi r^2$, where r is the radius of the sphere. Likewise, the volume of the same spherical volume is $4/3\pi r^3$. The ratio of volume to surface area of the spherical volume is thus r/3, which is a large ratio (for a significant value of r) characteristic of a benign lesion with smooth borders. However, a lesion with spiculated borders (malignant) has a significantly lower ratio. The surface area to volume ratio of biopsy-proven lesions, as well as the accepted false negative rate, determines the benign/malignant threshold value to be used. In the case where surface area to volume ratios provide equivocal information (predicted to be 1–2% of the cases on the basis of tumor characteristics and rates of occurrence), complete characterization of the lesion (tumor type and stage) may be possible by incorporation of information from additional MR scans.

The above described dual image contrast approach is not limited to the volumetric characterization of breast lesions, but is equally appropriate for other medical applications which seek to determine the extent of surface roughness. One example of such an application is articular cartilage surface degeneration during the course of osteo- and rheumatoid arthritis. Determination of the relative volume and surface area allows such progressive diseases to be followed either as a function of time or in response to therapy. Two different contrast image sets can be used to estimate the percentage of voxel volume occupied by the substance of interest (articular cartilage). This approach can be utilized with any digital imaging technique such as computed tomography (CT), ultrasound, nuclear medicine, positron emission tomography (PET), single photon emission tomography (SPECT), magnetic resonance (MR), digital X-ray, or even digital photography, which represents continuous objects in a discrete manner.

While only certain preferred features of the invention have been illustrated and described, many modifications and changes will occur to those skilled in the art. It is, therefore, to be understood that the appended claims are intended to cover all such modifications and changes as fall within the true spirit of the invention.

What is claimed is:

1. A method for identifying irregular shaped objects in a subject anatomy of a patient, comprising the steps of:

acquiring a desired image of the subject anatomy with a digital imaging system;

identifying voxels in the desired image which depict objects;

determining the surface of objects containing the identified voxels;

calculating the volume of each object;

calculating the surface area of each object;

calculating the ratio of volume and surface area of each object; and identifying irregularly-shaped objects when the ratio crosses a preselected threshold value.

2. The method as recited in claim 1 wherein the step of acquiring an image of the subject anatomy is performed by:

acquiring a first MRI image of the subject anatomy;

injecting a contrast agent into the patient to enhance acquired NMR signals;

acquiring an enhanced MRI image of the subject anatomy after arrival of the contrast agent in the subject anatomy; and subtracting the first MRI image from the enhanced MRI image to form said desired image.

3. The method as recited in claim 1 in which the desired image is a three-dimensional image produced using a 3D Fourier transformation.

4. The method as recited in claim 1 in which the objects are lesions and the identified irregularly-shaped objects are malignant tumors.

5. The method as recited in claim 4 in which the subject anatomy is a human breast.

6. The method as recited in claim 1 in which the step of determining the surface of objects containing the identified voxels is performed by:

connecting contiguous object voxels; and identifying boundary voxels in each object.

7. The method as recited in claim 6 in which the step of determining the surface of objects containing the identified voxels further includes:

determining the fraction of each boundary voxel that is within the object; and estimating a surface location in each boundary voxel.

8. The method as recited in claim 7 in which the step of determining the fraction of each boundary voxel that is within the object is performed by comparing brightness of the boundary voxel to the average of brightness values of voxels totally within the object.

9. The method as recited in claim 7 in which the objects are lesions and the identified irregularly-shaped objects are malignant tumors.

10. The method as recited in claim 9 in which the subject anatomy is a human breast.

* * * * *